United States Patent
Hamilton et al.

(10) Patent No.: US 7,692,962 B2
(45) Date of Patent: Apr. 6, 2010

(54) REDUCED STATE QUADBIT

(75) Inventors: Darlene Hamilton, White Salmon, WA (US); Fatima Bathul, Santa Clara, CA (US); Ken Tanpairoj, Stanford, CA (US); Ou Li, Fremont, CA (US); David Rogers, Sunnyvale, CA (US); Roger Tsao, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 110 days.

(21) Appl. No.: 11/958,557

(22) Filed: Dec. 18, 2007

(65) Prior Publication Data
US 2009/0154235 A1 Jun. 18, 2009

(51) Int. Cl.
*G11C 16/04* (2006.01)
(52) U.S. Cl. .......................... 365/185.03; 365/185.28; 365/185.33
(58) Field of Classification Search ............. 365/185.03
See application file for complete search history.

(56) References Cited

U.S. PATENT DOCUMENTS

| | | | |
|---|---|---|---|
| 6,956,768 B2 * | 10/2005 | Hamilton et al. ....... | 365/185.03 |
| 7,038,948 B2 * | 5/2006 | Hamilton et al. ........ | 365/185.2 |
| 7,130,210 B2 * | 10/2006 | Bathul et al. ............... | 365/100 |
| 7,471,568 B2 * | 12/2008 | Wu ....................... | 365/185.24 |
| 2006/0141709 A1 * | 6/2006 | Lung et al. ................. | 438/261 |
| 2008/0158954 A1 * | 7/2008 | Hamilton et al. ....... | 365/185.03 |
| 2008/0205140 A1 * | 8/2008 | Lee et al. .............. | 365/185.03 |
| 2009/0103357 A1 * | 4/2009 | Hamilton et al. ....... | 365/185.03 |

* cited by examiner

*Primary Examiner*—Son L Mai
(74) *Attorney, Agent, or Firm*—Eschweiler & Associates, LLC

(57) ABSTRACT

A reduced state memory device and methods of forming and programming multi-level flash memory cell element-pairs of the device, each element configured to store a blank level or two or more program levels are provided. In one embodiment, the reduced state memory device comprises a component configured to store in the memory cell element-pairs one pattern combination of a plurality of program pattern combinations comprising two blank levels, two program levels, and one blank level and one program level, the levels differing by less than a predetermined value. In one embodiment, a method of forming a memory device comprises forming at least one memory device of a multi-level flash memory array, each memory cell comprising two or more memory elements, each memory element configured to store three or more levels, and excluding one or more program pattern combinations that can be stored in the at least one memory cell.

20 Claims, 11 Drawing Sheets

Fig. 3A — Old MLB Pattern Definitions (16 State MLB)

| Left element Status | Left element | Right element | Right element Status |
|---|---|---|---|
| Blank | 1 | 1 | Blank |
| Blank | 1 | 2 | Level 2 program |
| Blank | 1 | 3 | Level 3 program |
| Blank | 1 | 4 | Level 4 program |
| Level 2 program | 2 | 1 | Blank |
| Level 2 program | 2 | 2 | Level 2 program |
| Level 2 program | 2 | 3 | Level 3 program |
| Level 2 program | 2 | 4 | Level 4 program |
| Level 3 program | 3 | 1 | Blank |
| Level 3 program | 3 | 2 | Level 2 program |
| Level 3 program | 3 | 3 | Level 3 program |
| Level 3 program | 3 | 4 | Level 4 program |
| Level 4 program | 4 | 1 | Blank |
| Level 4 program | 4 | 2 | Level 2 program |
| Level 4 program | 4 | 3 | Level 3 program |
| Level 4 program | 4 | 4 | Level 4 program |

Fig. 3B — New MLB Pattern Definitions (12 State MLB, Eliminate 13, 14, 31, 41)

| Left element Status | Left element | Right element | Right element Status |
|---|---|---|---|
| Blank | 1 | 1 | Blank |
| Blank | 1 | 2 | Level 2 program |
| Level 2 program | 2 | 1 | Blank |
| Level 2 program | 2 | 2 | Level 2 program |
| Level 2 program | 2 | 3 | Level 3 program |
| Level 2 program | 2 | 4 | Level 4 program |
| Level 3 program | 3 | 2 | Level 2 program |
| Level 3 program | 3 | 3 | Level 3 program |
| Level 3 program | 3 | 4 | Level 4 program |
| Level 4 program | 4 | 2 | Level 2 program |
| Level 4 program | 4 | 3 | Level 3 program |
| Level 4 program | 4 | 4 | Level 4 program |

REDUCED STATE QUADBIT

FIELD OF INVENTION

The present invention relates generally to memory devices and the like and in particular to a reduced state multi-level memory device and a method of forming and programming memory cells of multi-level flash memory devices.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual-bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks ease of erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

Flash memory is generally constructed of many memory cells where, generally, single bits of data are stored in and read from respective memory cells. The cells are generally programmed by hot electron injection and erased by Fowler-Nordheim tunneling or other mechanisms. As with many aspects of the semiconductor industry, there is a continuing desire and effort to achieve higher device packing densities and increase the number of memory cells on a semiconductor wafer. Similarly, increased device speed and performance are also desired to allow more data to be stored on smaller memory devices.

Individual flash memory cells are organized into individually addressable units or groups, which are accessed for read, program, or erase operations through address decoding circuitry. The individual memory cells are typically comprised of a semiconductor structure adapted for storing a bit of data and includes appropriate decoding and group selection circuitry, as well as circuitry to provide voltages to the cells being operated upon.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the charge stored in the cell. The memory device includes appropriate circuitry to sense the resulting cell current in order to determine the charge stored therein, which is then provided to data bus terminals of the device for access by other devices in a system in which the memory device is employed.

Programming circuitry controls a bit of a cell by applying a signal to a wordline, which acts as a control gate, and changing bitline connections such that the bit is stored by the source and drain connections. Programming a cell using a suitable mechanism such as hot electron injection, generally increases the threshold voltage of a cell. In operation, individual flash cells are addressed via the respective bitline and wordline using a peripheral decoder and control circuitry for programming (writing), reading or erasing functions. Erasing is performed as a blanket operation wherein an array or sector of cells can be simultaneously erased and typically produces a lower threshold voltage in the cell.

By way of further detail, a single bit of a flash memory cell may be programmed by a suitable mechanism, such as hot electron injection. Programming with hot-electron injection involves applying a relatively high voltage to the control gate and connecting the source to ground and the drain to a predetermined potential above the source. When a resulting electric field is high enough, electrons collect enough energy to be injected from the source onto the nitride layer of the ONO flash. As a result of the trapped electrons, the threshold voltage of the cell increases. This change in the threshold voltage (and thereby the channel conductance) of the cell created by the trapped electrons is what causes the cell to be programmed.

As with many aspects of the semiconductor industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer (or die).

For example, another type of flash memory is dual element nitride storage flash memory, which allows multiple bits to be stored in a single cell. In this technology, a memory cell is essentially split into two identical (mirrored) or complementary regions, each of which is formulated for storing one of two independent bits or elements. Each dual element nitride storage flash memory cell, like a traditional cell, has a gate, a source, and a drain. However, unlike a traditional stacked gate cell in which the source is always connected to an electrical source and the drain is always connected to an electrical drain, respective dual element nitride storage flash memory cells can have the connections of the source and drain reversed during operation to permit the storing of two bits or elements.

In virtual ground type architectures, dual element nitride storage flash memory cells have a semiconductor substrate with conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits or elements per cell by applying a signal to the wordline, which acts as a control gate, and changing bitline connections such that one element is stored by the source and drain being connected in one arrangement and a complementary element is stored by the source and drain being connected in another arrangement.

The closeness of such dual element nitride storage flash architectures, however, also causes certain undesirable phenomena to become prevalent. For example, isolating two elements or charges stored within a charge trapping layer becomes increasingly difficult as the channel length is decreased and the bits or elements are brought closer together. In this manner, the charge on the elements can contaminate or disturb one another, causing operations performed on the elements to be more challenging and introducing a greater opportunity for error. This interdependency or the affect that bits or elements can have on one another is sometimes referred to as complementary bit disturb or CBD.

Regardless of the flash architecture employed, reliably and accurately programming dual element nitride storage flash and multi-level flash cells can be particularly sensitive with the attendant complications of maintaining narrow Vt distributions and/or adequate read margins in order to accurately read and determine a data state from a corresponding Vt level. In addition, even if such narrow distributions can be attained for the various multiple levels, unless such read margins can be maintained during aging and cycle stresses, little competitive advantage may be gained.

In view of the foregoing, a continued need exists for an improved multi-level flash memory device and a method of forming and programming multi-level flash memory cells while maintaining adequate read margins and CBD control that achieves narrow Vt distributions of the element states.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention provides a reduced state multi-level flash memory device and a method of forming and programming the multi-level flash memory cells or multi-level flash memory bits (MLB) or elements having three or more data levels corresponding to three or more threshold voltages and data states. These goals may be accomplished by using a reduced or restricted subset of the possible data states to achieve improved read margins and CBD control that achieves highly compact Vt distributions. The three or more data levels include a blank level (e.g., L1) or erased state and two or more program levels (e.g., L2, L3, L4), for example, above the blank level or erased state. In addition, the method of the present invention is particularly applicable to cells having one or more physical bits or elements per cell, for example, two elements per memory cell or one element-pair per memory cell. The possible (e.g., three or more) data levels of the two elements of each element-pair, for example, provide a number of unique element pattern combinations which are termed "program patterns" herein (e.g., 21, 31, 41, 22, 23, 32, 24, 42, 33, 34, 43 and 44, such as the four data levels of a QuadBit memory cell).

In one embodiment, the present invention employs a restricted or reduced state MLB flash memory device, which restricts the choice of the program pattern combinations that may be stored in the MLB flash memory cells of the device. In particular, the program pattern combinations having the highest or worse case CBD voltage (e.g., the 13, 14, 41 and 31 program pattern combinations) are eliminated from use in the memory device. The inventors of the present invention have found that these worse case program pattern combinations and their corresponding worse case CBD voltages may be eliminated by limiting the maximum allowable difference between the program Vt and the erase Vt, also known as the delta Vt or $\Delta Vt$=(program Vt−erase Vt, or Vt(pgm)−Vt (blank)), or by simply limiting the level difference between the blank level and the program level in those program pattern combinations which include a blank level and a program level (e.g., 12, 21, 13, 31, 14 and 41).

In one embodiment, a memory device comprises at least one memory cell element-pair (e.g., dual element nitride storage flash cells having two physical elements or complementary elements per cell) of a multi-level flash memory array, the memory cell element-pair comprising first and second elements, each element configured to store a blank level and two or more program levels. In one embodiment, the memory device also includes a circuit configured to store in the at least one memory cell element-pair a program pattern of a plurality of program pattern combinations, comprising: two blank levels; (e.g., 11); two program levels (e.g., 22, 23, 24, 32, 33, 34, 42, 43, 44); and one blank level and one program level, the levels differing by less than a predetermined value For example, if the levels differ by a "predetermined value" of 3, then the blank level and program level combinations are limited to 12, 21, 13 and 31 in a four level MLB, and the patterns: 41 and 14 are excluded. Similarly, if the predetermined value=2, then the blank level and program level combinations are limited to 12, 21 in a four level MLB, and the patterns: 13 and 31, 41 and 14 are excluded.

In one embodiment, the levels differing by less than a predetermined value corresponds to a difference between a threshold voltage of the program level of the first element and the threshold voltage of the blank level of the second element (e.g., Vt(pgm)−Vt(blank), or $\Delta Vt$).

By limiting this threshold voltage difference, the CBD voltage shift is also reduced because the worse case CBD patterns are eliminated. This is because CBD is the Vt shift of a blank bit or element due to the disturb/charge it receives during programming of the other element in the cell, and this shift is greatest in those patterns which have the greatest Vt difference between the elements. That is, CBD=Vt after the disturb−Vt original of the blank bit or element.

In one embodiment, a method of forming a memory device comprises forming at least one memory cell of a multi-level flash memory array, each memory cell configured to store three or more levels, and excluding one or more program pattern combinations that can be stored in the at least one memory cell.

In one embodiment, the memory cell comprises a memory cell element-pair comprising a first element and a second element, each element configured to store a blank level and two or more program levels.

In one embodiment, the excluding one or more program pattern combinations that can be stored in the at least one memory cell element-pair comprises establishing a restricted plurality of program pattern combinations, comprising two blank levels (e.g., 11); two program levels (e.g., 22, 23, 24, 32, 33, 34, 42, 43, 44); and one blank level and one program level, wherein the difference between the corresponding threshold voltages of the blank level and the program level is less than a difference threshold voltage (e.g., 12, 21).

In another embodiment, a method of programming memory cell element-pairs of a multi-level flash memory array, each element of the element-pairs having a blank level and two or more program levels is disclosed wherein the method comprises providing two or more unprogrammed memory cell element-pairs, and programming one or more of the memory cell element-pairs to one of a plurality of program pattern combinations, comprising two blank levels (e.g., 11), two program levels (e.g., 22, 23, 24, 32, 33, 34, 42, 43, 44); and one blank level and one program level, wherein the difference between the corresponding threshold voltages of the blank level and the program level is less than a difference threshold voltage (e.g., with an appropriate ΔVt, only patterns 12 and 21 may be allowed in this "one blank level and one program level" set, while pattern combinations 13, 31, 14, 41 would be excluded).

In another aspect of the present invention, one or both of the programming gate and drain voltages may both be varied and may be applied during program pulsing to program the memory cells.

In another aspect of the invention, the Vd and/or Vg of the programming pulses may be represented as programming profiles which may further be tailored to accommodate the various combinations of program patterns possible within the element-pair. For example, in a dual element nitride storage flash four level cell, there are (potentially) 16 possible states (data states) or combinations of element-pair patterns (e.g., 11, 12, 21, 13, 31, 14, 41, 22, 23, 32, 24, 42, 33, 34, 43, 44).

The multi-level bit or element MLB flash memory cell of the present invention may comprise a single physical element that can be programmed to three or more levels corresponding to three or more data states. Alternately, the MLB cell may comprise a dual element nitride storage flash cell having two physically distinct elements that may each be programmed to multiple levels such as four, wherein 16 possible states are then available. In the reduced state MLB dual element nitride storage flash cell having the same number of program levels (e.g., L2, L3, L4), however, a restricted subset of 12 possible data states, for example, may be used (e.g., 21, 22, 23, 32, 24, 42, 33, 34, 43, 44), wherein the worse case CBD pattern combinations (e.g., 13, 14, 41, 31) are restricted from use. In another example, the reduced or restricted subset of states may comprise 10 states, where 12, 21, 13, 31, 14 and 41 are excluded, or the reduced or restricted subset can be 14 possible data states, where 14 and 41 are excluded. The system and method may be suitably implemented in a variety of flash memory architectures including single and dual element nitride storage flash EEPROM, and other such single or multi-bit or multi-element memory architectures that may be electrically programmed, and any such cell or variant is contemplated as falling within the scope of the present invention.

The present invention provides a system and method of forming and programming an array of MLB memory cells that yields an improved read margins and CBD control that achieves highly compact Vt distributions.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 3A is a chart of possible program pattern combinations for a dual element nitride storage flash memory cell such as a QuadBit flash memory cell, wherein each of the elements can be stored at four (4) different data levels.

FIG. 3B is a chart of possible program pattern combinations for a dual element nitride storage flash memory cell such as a reduced state QuadBit flash memory cell, wherein each of the elements can be stored at four (4) different data levels, and wherein some high CBD program pattern combinations are restricted in accordance the method of the present invention.

DETAILED DESCRIPTION OF THE INVENTION

Figure 1A:
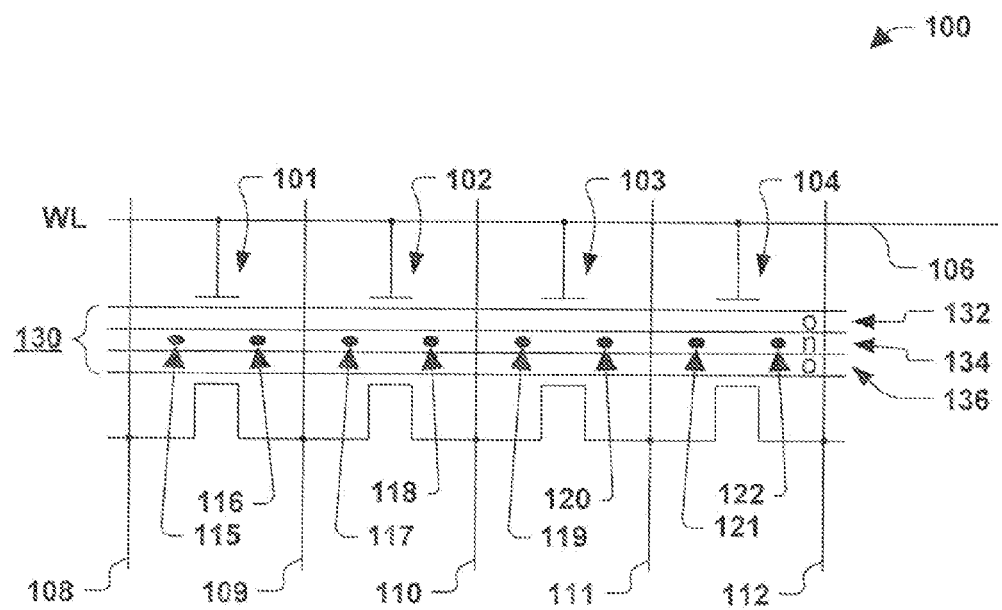
FIG. 1A is a schematic illustration of a portion of a wordline of dual element nitride storage flash memory cells.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

Improvements in the density of memory devices translate to increased memory capacity. Density and thus capacity is a major consideration in the cost of fabrication and the marketability of memory devices, and is directly related to the amount of real estate used to store a bit of information on a semiconductor chip. Density may be increased, for example, by scaling down feature size to accommodate more memory cell transistors on a given size chip thereby achieving higher density. Another technique to increase density and reduce manufacturing costs is thru the use of multi-level cell technology.

Multi-level cells increase cell density by increasing the number of possible logical states or data states associated with a cell, thereby allowing a single memory cell to store information corresponding to more than one data bit. One way this has been done is by using multiple (three or more, in the context of cell levels and states) threshold voltage (Vt) levels, which correspond to multiple data states per cell. This contrasts to the two states and levels used in conventional (1 or 0) flash memory cells. Thus, in one example, a single dual element nitride storage flash cell may have two physical bits or elements of data per cell, each element at four Vt levels corresponding to storage of four logical states. Cells, having two elements per cell and/or having multiple levels per cell, however, present many new problems attempting to maintain well controlled or tight distributions of the Vt levels, particularly as larger data bit quantities are considered.

As a result of these trends, accurate programming, erasure, and the determination of the levels of such multi-level cells becomes increasingly demanding, particularly as higher bit capacities are expected of a single cell. Accordingly, multi-level memory cells need to be programmed to a well controlled narrow program Vt distribution (tight element compacting). In addition, multi-element and multi-level cells need to maintain adequate read margins (the Vt gap between adjacent program level Vt distributions) and CBD control over voltage and cycling stresses and aging of the memory device. Such device requirements and issues are likely to increase as device features continue to shrink and the density of memory cells increases.

As indicated previously, however, due to such high density architectures that include dual element nitride storage flash type cell structures, the charge on the selected element during programming of the element-pair can contaminate or disturb the other element in the element-pair referred to as complementary bit disturb or CBD. This interdependency or the affect that elements can have on one another causes operations performed on the elements to become more challenging and introducing greater opportunity for error during the read operation. In an element-pair of a multi-level (e.g., four-level) memory cell, if one side is programmed to a very high Vt such as program level 3 or level 4, while the other side is not programmed (blank) such as program pattern 31 or 41, there is a tendency to loose more charge during program disturb due to stress compared to an element-pair which is programmed on both sides of the cell or when both elements are programmed. This higher charge loss due to program patterns 31 and 41 has been a limiting factor in the use of larger sectors, which translates to a lower cost, and use of partial sector erase methods, which provides better performance.

Accordingly, it is a goal of the present invention to provide a reduced state memory device and a method of forming and programming an array of such MLB flash memory cells, which achieves the aforementioned requirements while also providing improved Vt program distributions, Vt margins between the Vt program distributions, endurance, reliability, performance, less program disturb with programming stress, reduced charge loss with cycling and age, lower cost, as well as reduced CBD effects.

A multi-level program algorithm may be used in accordance with the present invention to program words having, for example, 8, 16, or 32 bits per word of an array of multi-level flash memory cells MLB to a desired element-pair pattern.

The methods may be suitably implemented in a variety of flash memory architectures including single and dual element nitride storage flash EEPROM, and other such single and multi-element memory architectures that may be electrically programmed, and any such cell or variant is contemplated as falling within the scope of the present invention.

Referring initially to FIG. 1A, a schematic illustration is presented of a portion of a wordline of dual element nitride storage flash core memory cells 100 such as may be included in at least part of an array of multi-level flash memory cells. The circuit schematic shows a group of memory cells 101 through 104 in a virtual ground type implementation, for example. The respective memory cells 101 through 104 are connected to a wordline 106, which serves as a control gate, and pairs of the memory cells share a common bitline. For instance, in the example shown, the memory cell 101 has associated bitlines 108 and 109; the memory cell 102 has associated bitlines 109 and 110; the memory cell 103 has associated bitlines 110 and 111; and the memory cell 104 has associated bitlines 111 and 112. As such, cells 101 and 102 share bitline 109, cells 102 and 103 share bitline 110 and cells 103 and 104 share bitline 111, respectively.

Depending upon wordline voltages and bitline connections, the memory cells 101 through 104 are capable of writing, reading, and erasing elements at locations 115 through 122. In addition to voltages applied to the wordline 106, reading the element (e.g., "A" element of cell 101) at location 115, for example, is achieved through connection of the drain to the bitline 109 and the source to the bitline 108. Similarly, reading the element (e.g., "B" element of cell 101) at location 116 is achieved through connection of the drain to the bitline 108 and the source to the bitline 109. Storage of multiple bits is made possible, at least in part, by a charge trapping dielectric layer 130 interposed between the bitlines and the wordline. The charge trapping dielectric layer 130 includes multiple insulating layers 132, 136 (e.g., of oxide based material) that sandwich a charge trapping layer 134 (e.g., of nitride based material). Given its layer to layer composition, the charge trapping dielectric layer 130 is often referred to as an ONO layer (for the oxide, nitride, oxide layers).

The ONO layer 130 allows the different bits or elements to be stored at multiple states or levels as well. For example, depending upon the voltage applied to the memory cells 101 through 104 by the control gate or wordline 106 and drain during programming, varying amounts of charge can be stored at locations 115 through 122. The different amounts of charge may correspond to different bit states or levels, for example. If four different charge levels or data levels (e.g., 1, 2, 3 and 4) can be stored at each of the bit or element locations 115 through 122, for example, then each two-element cell 101 through 104 can have 16 different combinations of stored data (e.g., 1-1, 1-2, 1-3, 1-4, 2-1, 2-2, 2-3, 2-4, 3-1, 3-2, 3-3, 3-4, 4-1, 4-2, 4-3 and 4-4) which may also be represented as (e.g., 11, 12, 13, 14, 21, 22, 23, 24, 31, 32, 33, 34, 41, 42, 43 and 44), respectively.

Figure 1B:
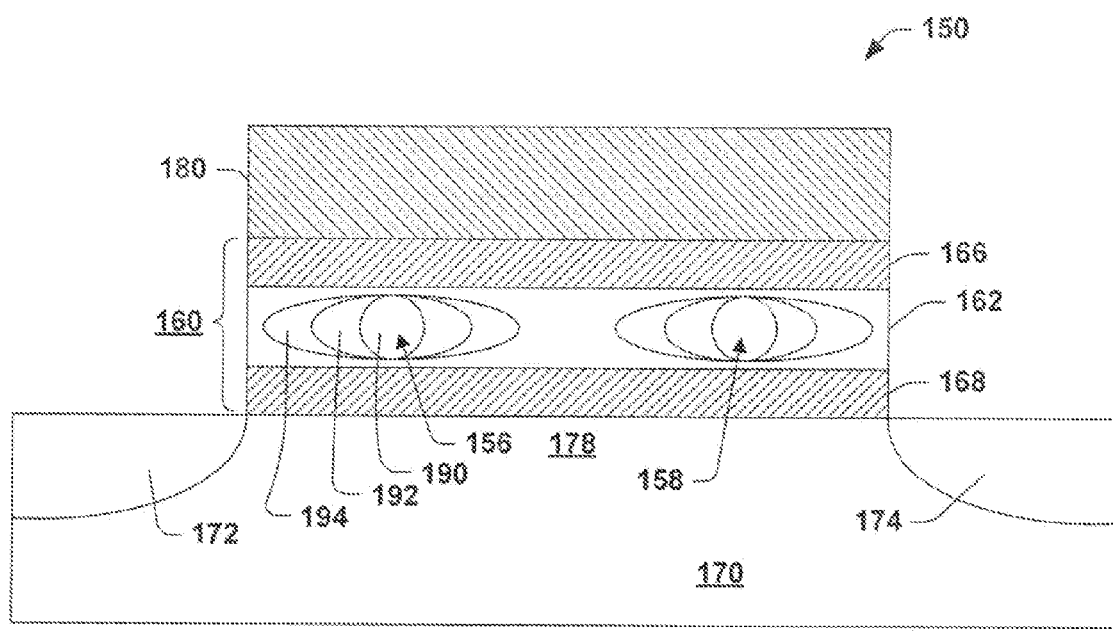
FIG. 1B is a cross-sectional view of a dual element nitride storage flash memory cell wherein each of the elements can be stored at multiple levels.

FIG. 1B is a cross sectional view of a dual element nitride storage flash memory cell 150 illustrating the capability of the cell to store varying degrees of charge at element locations

156 and 158. It will be appreciated that the memory cell 150 may, for example, correspond to the memory cells 101 through 104 depicted in FIG. 1A. The cell 150 includes a charge trapping dielectric layer (ONO layer) 160 that comprises a charge trapping layer 162 sandwiched between two dielectric layers 166, 168. The charge trapping layer 162 is formed from one or more substantially non-conductive substances, such as nitride based materials. The dielectric layers 166, 168 are similarly formed from one or more electrically insulating substances, such as oxide based materials.

The charge trapping ONO layer 160 is formed over a substrate 170 that may be formed from silicon or some other semiconductor material, for example. The substrate 170 may be selectively doped with a p-type dopant, such as boron, for example, to alter its electrical properties. In the example illustrated, the substrate 170 has buried bitlines or bitline diffusions including a first bitline diffusion 172 and a second bitline diffusion 174. The bitline diffusions 172 and 174 may, for example, be formed by an implanted n-type dopant, and may correspond to bitlines 108 through 112 in FIG. 1A. A channel 178 is defined within the substrate between the first 172 and second 174 bitline diffusions (e.g., S/D extensions, deep S/D regions).

Overlying the upper dielectric layer 166 of the ONO layer 160 is a gate 180. This gate 180 may be formed from a polysilicon material, for example, and may be doped with an n-type impurity (e.g., phosphorus) to alter its electrical behavior. The gate 180 may, for example, correspond to the wordlines 106 in FIG. 1A. The gate 180 enables a voltage to be applied to the cell 150 such that respective charges can, among other things, be stored within the cell at locations 156, 158, depending upon the electrical connections of the bitline diffusions 172, 174.

The dual element nitride storage flash memory cell 150 is generally symmetrical, thus the bitline diffusions 172 and 174 are interchangeable as acting source and drain. Thus, the first bitline diffusion 172 may serve as the source and the second bitline diffusion 174 as the drain with respect to right element location 158 for programming. Likewise, the second bitline diffusion 174 may serve as the source and the first bitline diffusion 172 as the drain for the left element location 156 for programming. The cell 150 can be programmed by applying a voltage across the gate 180 and an acting drain region, and connecting an acting source region to ground, for example.

When programming the cell 150, the acting drain region is typically biased to a potential above the acting source. As a result of the gate bias, a high electric field is applied across the charge trapping layer 162. Due to a phenomenon known as "hot electron injection", electrons pass from the acting source region through the lower dielectric layer 168 and become trapped in the charge trapping layer 162 at locations 156 or 158, also known as left element location 156 and right element location 158. It will be appreciated that a second element can be programmed to the alternate location 158 or 156 by reversing the acting source and drain and again applying a bias to the control gate 180.

By way of example, the left element location 156 can be programmed by applying a program voltage to the gate 180 and a drain voltage to the first bitline 172, which is an acting drain for the left location 156. The second bitline 174, which is an acting source for programming the left element location 156, can be connected to ground, or biased to a different voltage level. The applied voltages generate a vertical electric field through the dielectric layers 168 and 166 and also through the charge trapping layer 162, and generate a lateral electric field across a length of the channel 178 from the first bitline diffusion 172 to the second bitline diffusion 174. At a given voltage, the channel 178 inverts such that electrons are drawn off the acting source (the second bitline diffusion 174 in this example) and begin accelerating towards the acting drain (the first bitline diffusion 172 in this example).

As the electrons move along the length of the channel 178, the electrons gain energy and, upon attaining enough energy, the electrons jump over the potential barrier of the bottom dielectric layer 168 and into the charge trapping layer 162, where the electrons become trapped. The probability of electrons jumping the potential barrier in this arrangement is a maximum in the area of the left element location 156, adjacent the first bitline diffusion 172, where the electrons have gained the most energy. These accelerated electrons are termed hot electrons and, once injected into the charge trapping layer 162, stay in about the general area indicated for the left element. The trapped electrons tend to remain generally localized due to the low conductivity of the charge trapping layer 162 and the low lateral electric field therein. Programming the right element location 158 is similar, but the second bitline 174 operates as an acting drain and the first bitline 172 operates as an acting source.

For a read operation, a certain voltage bias is applied across an acting drain to an acting source of the cell 150. The acting drain of the cell is a bitline, which may be connected to the drains of other cells in a byte or word group. A voltage is then applied to the gate 180 (e.g., the wordline) of the memory cell 150 in order to cause a current to flow from the acting drain to the acting source. The resulting current is measured, by which a determination is made as to the value of the data stored in the cell. For example, if the current is above a certain threshold, the element is deemed unprogrammed or a logical one, whereas if the current is below a certain threshold, the element is deemed to be programmed or a logical zero. A second element can be read by reversing operations of the first and second bitline diffusions 172 and 174 for the acting drain and the acting source.

It can be appreciated that if the voltages utilized to program the left 156 and right 158 element locations of the cell 150 are increased or sustained for longer periods of time, the number of electrons or amount of charge stored at these locations can be increased or otherwise varied. This allows the cell 150 to be utilized for additional data storage. For example, different amounts of charge can correspond to different programmed states. In the example illustrated, for instance, both the left 156 and right 158 element locations can be said to have four different states or levels, namely 1, 2, 3 and 4, where level 1 (L1) corresponds to a situation where the locations are blank or un-programmed, and levels 2, 3 and 4 (L2, L3, and L4, respectively) correspond to programmed levels or increased amounts of stored charge, respectively. With regard to the left element location 156, for example, a level 2 (L2) may correspond to a relatively small amount of stored charge 190, while level 3 (L3) and level 4 (L4) may correspond to increasingly larger amounts of stored charge 192 and 194, respectively. As indicated previously, this technique is also called multi-level cell technology, which is useful to increase density and reduce manufacturing costs.

Multi-level cells increase the effective cell density by increasing the number of possible logical states or data states associated with a cell, thereby allowing a single memory cell to store information corresponding to more than one data bit. One way this has been done is by using multiple (three or more, in the context of cell levels and states) threshold voltage (Vt) levels, which correspond to multiple data states per cell. This contrasts to the two states or levels used in conventional flash memory cells. Thus, in the example above, a single dual element nitride storage flash cell may store in each of its two physical elements four Vt levels corresponding to four logical states.

Figure 2A:
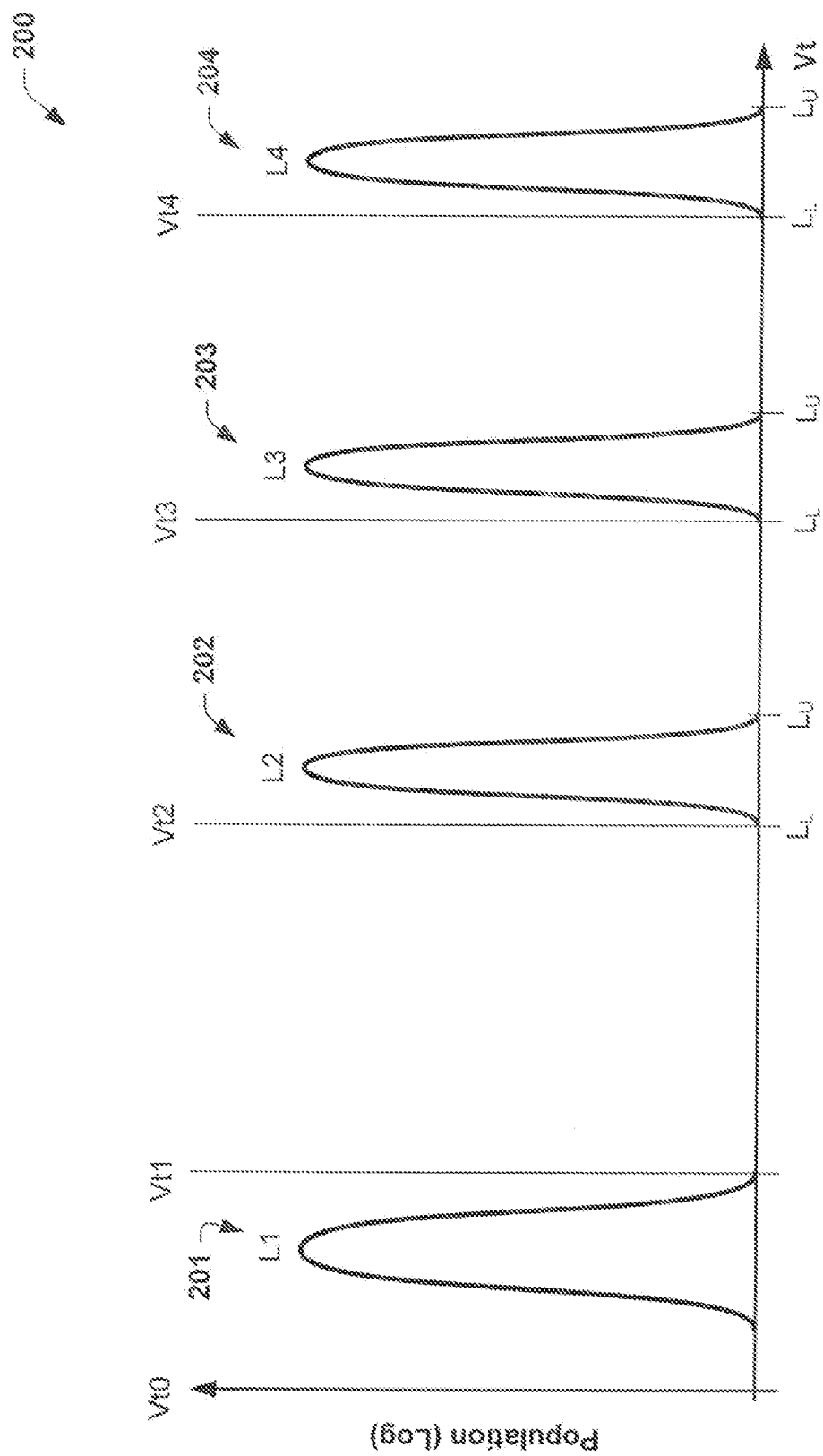
FIG. 2A is an idealized Vt distribution of a four level multi-level cell in accordance with an aspect of the present invention and such as may apply to the dual element nitride storage flash cell of FIG. 1B.

For example, FIG. 2A illustrates an idealized unsigned Vt distribution 200 of a four level MLB cell in accordance with an aspect of the present invention is illustrated such as may apply to the dual element nitride storage flash cell of FIG. 1B. Vt distribution 200 represents four discrete populations of memory bit or element threshold voltages. Each threshold voltage population occupies a range of Vt values separated into four discrete levels designated levels L1 (201), L2 (202), L3 (203), and L4 (204). Each level (e.g., L1, L2, L3, and L4) of the respective Vt population further may have a corresponding target threshold voltage, for example, Vt1, Vt2, Vt3, and Vt4, respectively. For purposes of simpler program and read verification, the target threshold voltage for the corresponding level may be located at one of the upper Vt limits ($L_U$) or lower Vt limits ($L_L$) of the respective level as shown. For example, if L1 is chosen as the erased state of a four-level device, a voltage read detected below Vt1 indicates an erased or unprogrammed state, while a Vt voltage detected greater than Vt2 but less than Vt3 indicates an L2 level, a Vt voltage detected greater than Vt3 but less than Vt4 indicates an L3 level, and a Vt voltage detected greater than Vt4 indicates an L4 level.

The various levels of FIG. 2A, however, may be arbitrarily assigned corresponding binary states (e.g., L1=11, L2=10, L3=01, and L4=00, or L1=00, L2=01, L3=10, and L4=11) as desired by the user. The four-level MLB cell associated with the distribution 200 may comprise a single physical element that can be programmed to two levels or more (plus a blank level), or alternatively, may comprise a dual element nitride storage flash cell having two physically distinct bits or elements that may each have multiple levels such as four, wherein 16 possible combinations of states between the two elements.

The reduced state system and methods of the present invention are suitably implemented in MLB memory devices having any number of levels and combination of both positive and negative Vt distributions. In FIG. 2A, for example, the method of the present invention is equally applicable whether Vt0 or Vt1, Vt4, or another such Vt limit is used as a zero voltage potential or another reference potential of the memory cells. Although the example would seem to imply that the L1 level corresponds to the erased condition, the L1, L4, or any other level may represent the erased state. Further, target threshold voltages Vt2, Vt3, and Vt4 may, for example, have values such as Vt2=1.5V, Vt3=2.1V, and Vt4=2.7V from Vt1.

Considering the four levels of FIG. 2A as applied to the dual element nitride storage flash memory elements examples of FIGS. 1A and 1B, the memory element-pairs (or cells) initially erased to L1 data states to a target threshold voltage of Vt2, Vt3, or Vt4, may be programmed as desired, corresponding to the L2, L3, and L4 levels or data states in a programming operation. For example, pulses may be applied to the element-pairs chosen along a wordline to be programmed to a selected word, bit or element pattern or "program pattern", such as 21 (L2 for the left element, and L1 for the right element) or any other combination of words or program patterns. Programming pulses may be applied according to a predetermined Vd profile of successive programming pulses applied to the memory cells, while a gate voltage (Vg) is either held constant or also applied according to a predetermined pulsing profile (e.g., stepped pattern, ramp pattern). The elements of the complementary element-pairs are alternately programmed in this way, until the Vt of each element of the element-pair achieves a respective final target threshold voltage corresponding to the respective program level.

Figure 2B:
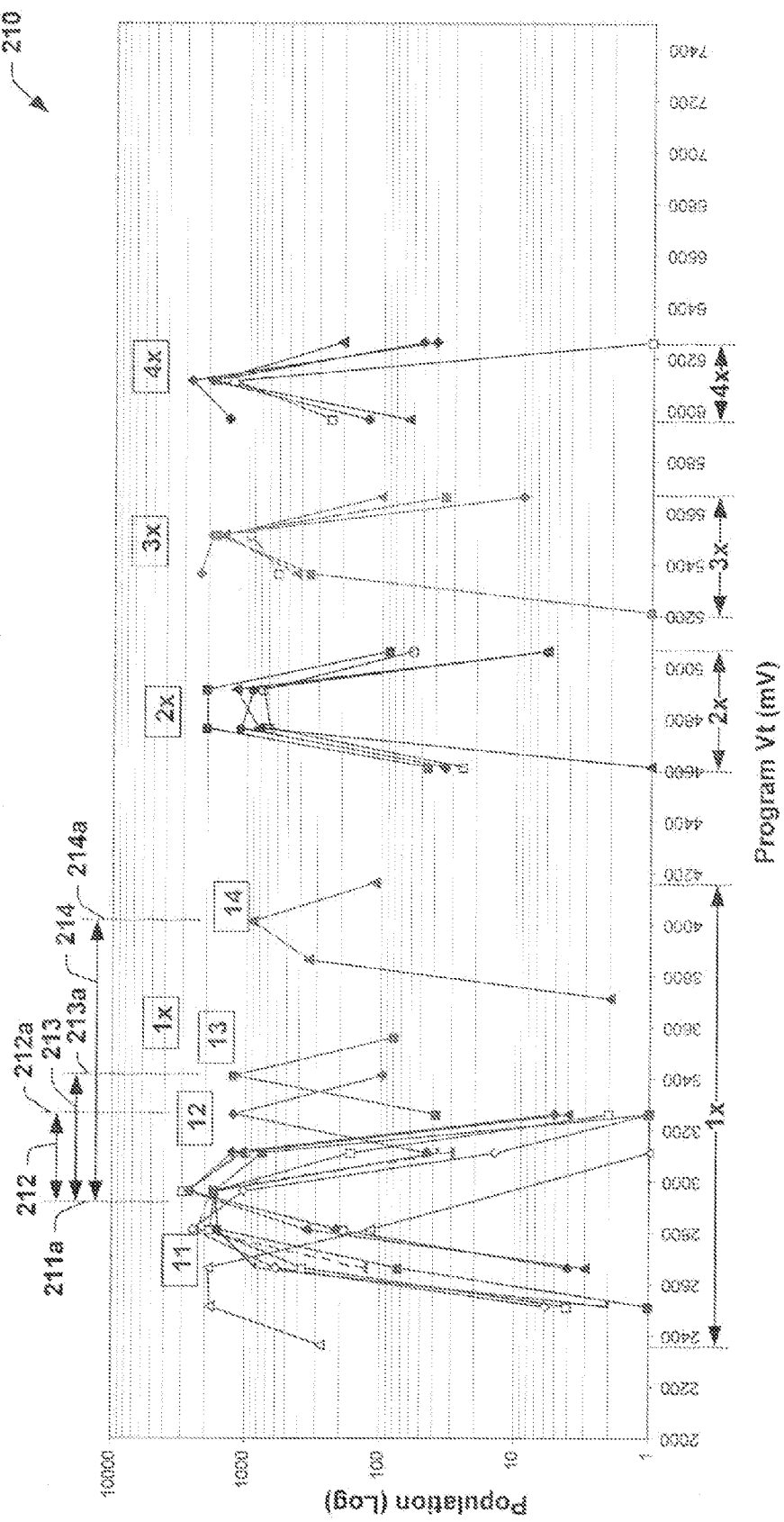
FIG. 2B is an actual Vt distribution of a population of four level multi-level cells and the corresponding Vt margins such as may apply to the dual element nitride storage flash cell of FIG. 1B.

FIG. 2B illustrates an actual Vt distribution 210 of a population of four level multi-level cells and the corresponding Vt margins such as may apply to the dual element nitride storage flash cells of FIGS. 1A and 1B.

FIG. 2B further illustrate the unprogrammed or blank "11" data state, from which all the other 16 possible states (data states) or combinations of element-pair program patterns (e.g., 11, 12, 21, 13, 31, 14, 41, 22, 23, 32, 24, 42, 33, 34, 43, 44) of the QuadBit, for example, may originate. Distributions 210 comprise, therefore, four families of distributions: the 1×, 2×, 3×, and 4× distribution families. For example, the 1× distribution family comprises the 11, 12, 13, and 14 program pattern distributions, the 2× distribution family comprises the 21, 22, 23, and 24 program pattern distributions, the 3× distribution family comprises the 31, 32, 33, and 34 program pattern distributions, the 4× distribution family comprises the 41, 42, 43, and 44 program pattern distributions. Although the 2×, 3×, and 4× actual real-world distributions have a reasonable approximation (in the Vt width of the distributions) to the corresponding ideal distributions of FIG. 2A, it will also be observed that the 1× family distributions vary widely, for example, between the 11 pattern distribution and the 14 pattern distribution. This variation is due to the CBD effects between the 11 pattern distribution and the 14 pattern distribution.

CBD is the Vt shift in a blank (not programmed) element of an element-pair of a dual element nitride storage flash memory cell, for example, due to a disturb when the second element in that element pair is programmed. That is, the blank bit basically receives some charge due to this disturb.

For example, the center or peak of the 2× distribution family occurs at a Vt of about 4.85V, with the 21, 22, 23, and 24 all residing within a Vt range of 4.6V to 5.05V, the 3× center at a Vt of about 5.5V, with the 31, 32, 33, and 34 all residing within a Vt range of 5.2V to 5.66V, and the 4× center at a Vt of about 6.1V, with the 41, 42, 43, and 44 all residing within a Vt range of 5.95V to 6.25V. By contrast, however, the 1× family distributions range widely, for example, from a Vt of about 2.3V to about 4.15V. In particular, the inventors of the present invention have concluded that if the 11 pattern distribution has a nominal Vt center $Vt_{(11)}$ at 211a of about 2.9V, then the 12 pattern distribution has a shifted nominal Vt center $Vt_{(12)}$ at 212a of about 3.27V, the 13 pattern distribution has a shifted nominal Vt center $Vt_{(13)}$ at 213a of about 3.42V, and the 14 pattern distribution has a shifted nominal Vt center $Vt_{(14)}$ at 214a of about 4.02V. Accordingly, the change or shift in the Vt between the 11 distribution and the 12 distribution is $\Delta Vt_{(CBD)}$ 212=about 3.27−2.9V=0.37V, the change or shift in the Vt between the 11 distribution and the 13 distribution is $\Delta Vt_{(CBD)}$ 213=about 3.42−2.9V=0.52V, the change or shift in the Vt between the 11 distribution and the 14 distribution is $\Delta Vt_{(CBD)}$ 214=about 4.02−2.9V=1.12V in this example. The inventors of the present invention have also realized that the Vt shifts are due to the CBD effects represented by 12, 13 and 14, due to programming patterns 21, 31 and 41 on other side of the cell or other element in a particular element-pair.

Another way to describe this CBD shift is as follows: in a 11 element-pair pattern, one element is programmed to L2 or L3 or L4 while the other second element gets little charge (where the 11 blank Vt shifts to a higher level) due to a disturb produced by programming the first element.

Programming one element to program pattern 21—the other blank side becomes 12, while its Vt is shifted from the 11 position to the 12 position at 212 in FIG. 2B. 12 is the CBD for the 21 pattern. The CBD shift is 212 in FIG. 2B.

Programming one element to program pattern 31—the other blank side becomes 13, while its Vt is shifted from the 11 position to the 13 position at 213 in FIG. 2B. 13 is the CBD for the 31 pattern. The CBD shift is 213 in FIG. 2B.

Programming one element to program pattern 41—the other blank side becomes 14, while its Vt is shifted from the 11 position to the 14 position at 214 in FIG. 2B. 14 is the CBD for the 41 pattern. The CBD shift is 214 in FIG. 2B.

In conclusion, the higher the programming Vt for the element being programmed in the element-pair, the higher the CBD shift to its corresponding CBD element, which is the other blank element in the element-pair.

The inventors of the present invention have therefore realized that the 14, 13, and the 41, 31 program patterns (and data states) are limiting the read margins, disturb performance and data retention capabilities of the four-level dual-element nitride storage flash memory cell (e.g., QuadBit), for example, as will be shown and discussed in greater detail infra, in association with the following figures.

FIG. 3A illustrates a chart 310 of possible program pattern combinations for a dual element nitride storage flash memory cell such as a QuadBit flash memory cell 150 of FIG. 1B that may be used in accordance with the present invention. For example, each of the elements of the element-pair can be stored at four (4) different data levels L1, L2, L3, and L4, and wherein a program element may be programmed to a non-blank level (program level L2, L3, and L4). Accordingly, the four-level QuadBit memory cell is capable of 16 data states.

Chart 310 further illustrates a left element (e.g., element 156 of cell 150 of FIG. 1B) in column 324, and a right element (e.g., element 158 of cell 150 of FIG. 1B) in column 326 of FIG. 3A. Column 322 indicates the left element status (e.g., a blank or program level), while column 328 indicates the right element status (e.g., a blank or program level). Together, columns 324 and 326 illustrate the element pattern combinations (e.g., 11, 12, 21, 13, 31, 14, 41, 22, 23, 32, 24, 42, 33, 34, 43, 44) represented by the respective element-pair data states when the left element is read from the cell, for example. Chart 310 also illustrates the element-pair patterns 13 (313), 14 (314), 31 (331), and 41 (341) which have been identified as limiting the read margins, disturb performance and data retention capabilities of the four-level dual-element nitride storage flash memory cell.

FIG. 3B illustrates a chart 350 of possible program pattern combinations for a dual element nitride storage flash memory cell such as a reduced state QuadBit flash memory cell (e.g. 150 of FIG. 1B), wherein each of the elements can be stored at four (4) different data levels, and wherein some high CBD program pattern combinations are restricted in accordance the method of the present invention. In particular, the high CBD voltage element-pair pattern or data state combinations 13 (313), 14 (314), 31 (331) and 41 (341) of FIG. 3A are restricted from use in the four-level dual-element nitride storage flash memory cell device of the present invention of FIG. 3B, thereby providing a reduced state (e.g., 12 state) memory device with improved read margins and CBD control that achieves highly compact Vt distributions.

Chart 350 also illustrates a left element (e.g., element 156 of cell 150 of FIG. 1B) in column 354, and a right element (e.g., element 158 of cell 150 of FIG. 1B) in column 356 of FIG. 3B. Column 352 indicates the left element status (e.g., a blank or program level), while column 358 indicates the right element status (e.g., a blank or program level). Together, columns 354 and 356 illustrate the element pattern combinations (e.g., 11, 12, 21, 22, 23, 32, 24, 42, 33, 34, 43, 44) represented by the respective element-pair data states when the left element is read from the cell, for example.

Figure 3C:
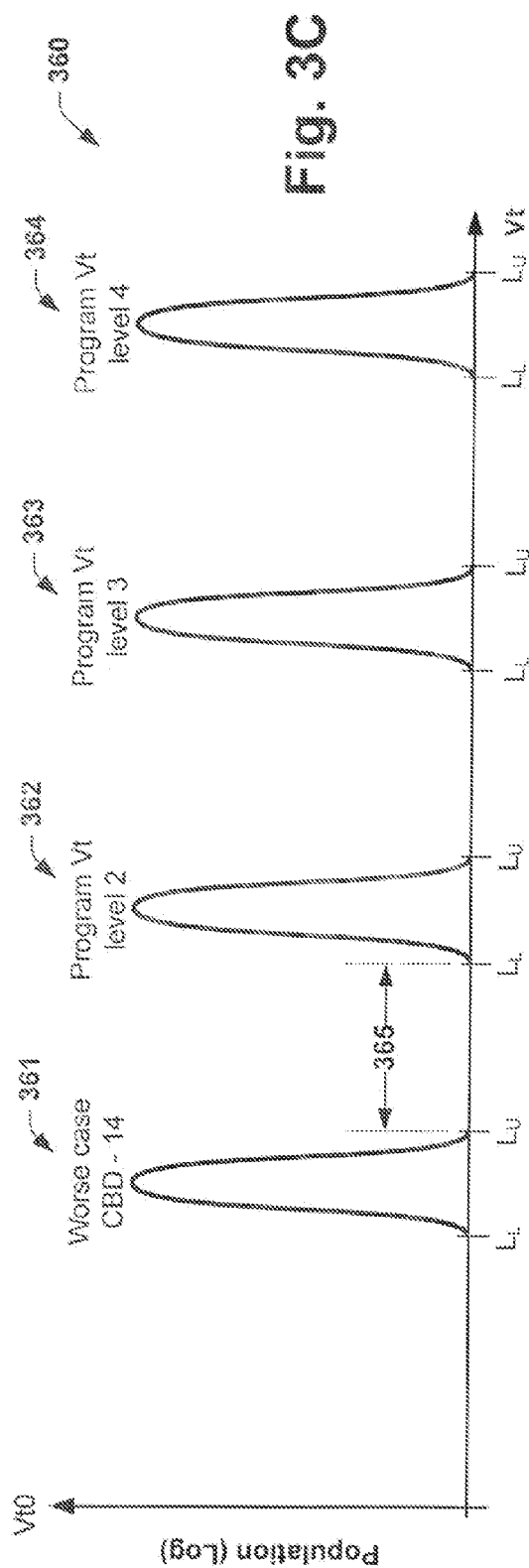
FIG. 3C is an idealized Vt distribution of a four level multi-level cell having three program levels and further illustrating the worse case CBD voltage program pattern combination when 16 states are allowed and such as may apply to the dual element nitride storage flash cell of FIG. 1B.

FIG. 3C illustrates an idealized Vt distribution 360 of four level multi-level cells having three program levels and further illustrating the worse case CBD voltage program pattern combinations when all 16 states are allowed and such as may apply to the dual element nitride storage flash memory cell of FIG. 1B. For example, the typical 16 state four-level distributions 360 have a level 1 distribution family that includes the worse case CBD voltage pattern 14 distribution 361, a level 2 program Vt distribution 362, a level 3 program Vt distribution 363, a level 4 program Vt distribution 364. Accordingly, a read margin (AKA "window") 365 between the 14 CBD Vt 361 and the level 2 program Vt distribution 362, may be relatively narrow. To improve on this read margin 365, the present invention restricts the 14 CBD Vt 361, and the 13 CBD Vt (see FIG. 2B) from the data state or program patterns which can be used.

Thus, in the four-level memory device of FIG. 3C, it will be appreciated that the CBD highest level L4 Vt is less than the lowest L2 program Vt, the highest L2 program Vt is less than the lowest L3 program Vt, and the highest L3 program Vt is less than the lowest L4 program Vt.

Figure 3D:
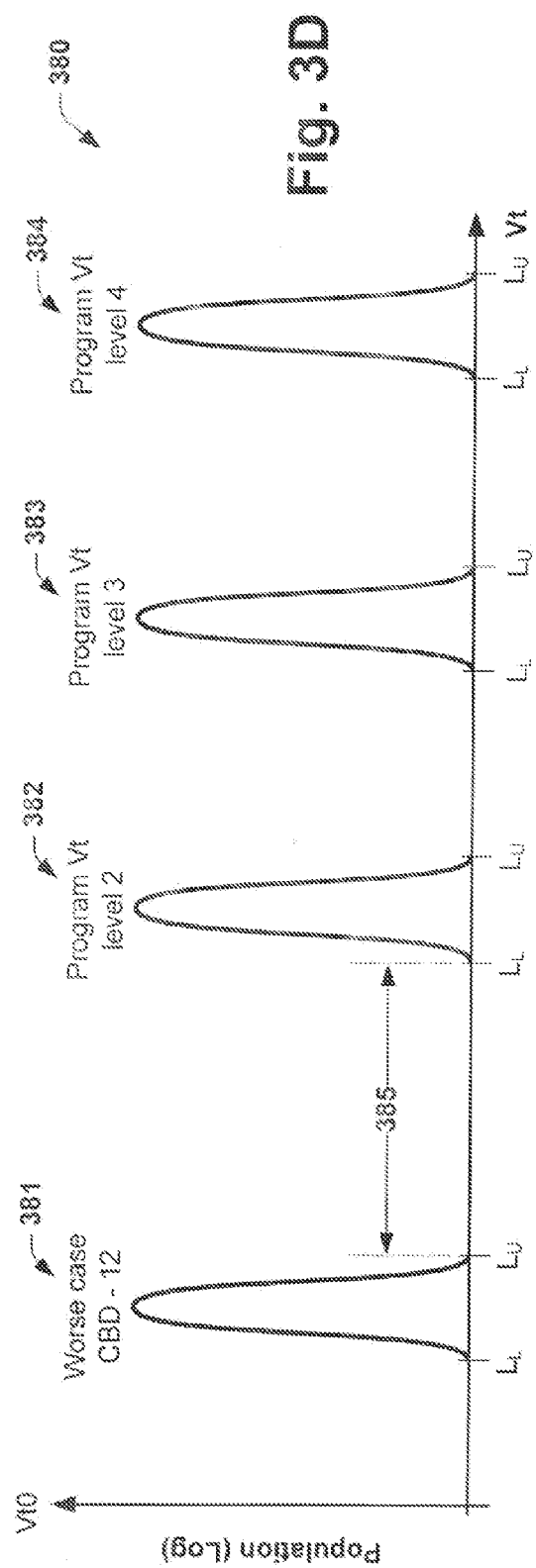
FIG. 3D is an idealized Vt distribution of a four level multi-level cell having three program levels and further illustrating the worse case CBD voltage program pattern combination when 12 select states are allowed such as may apply to a reduced state QuadBit flash memory cell and the dual element nitride storage flash cell of FIG. 1B.

For example, FIG. 3D illustrates an idealized Vt distribution 380 of four level multi-level cells having three program levels and further illustrating the worse case 12 CBD voltage program pattern 38 combination when restricted to 12 selected states of the possible 16 states, such as may apply to a reduced state QuadBit flash memory device and the dual element nitride storage flash memory cell of FIG. 1B. The reduced state QuadBit memory device of the present invention, have a level 1 distribution family that includes the worse case CBD voltage pattern 12 distribution 381, a level 2 program Vt distribution 382, a level 3 program Vt distribution 383, a level 4 program Vt distribution 384. Accordingly, an improved read margin, or window 385 between the 12 CBD Vt 381 and the level 2 program Vt distribution 382, is greatly widened relative to the 16 state QuadBit memory of FIG. 3C, by restricting the allowable CBD voltage, and removing the 14 CBD Vt 361, and the 13 CBD Vt (see FIG. 2B) from the data state or program patterns which can be used.

Thus, in the reduced state (e.g., with 13, 14, 41, 31 eliminated) four-level memory device of FIG. 3D, it will be appreciated that the CBD highest level L2 Vt is less than the lowest L2 program Vt, the highest L2 program Vt is less than the lowest L3 program Vt, and the highest L3 program Vt is less than the lowest L4 program Vt.

Figure 4:
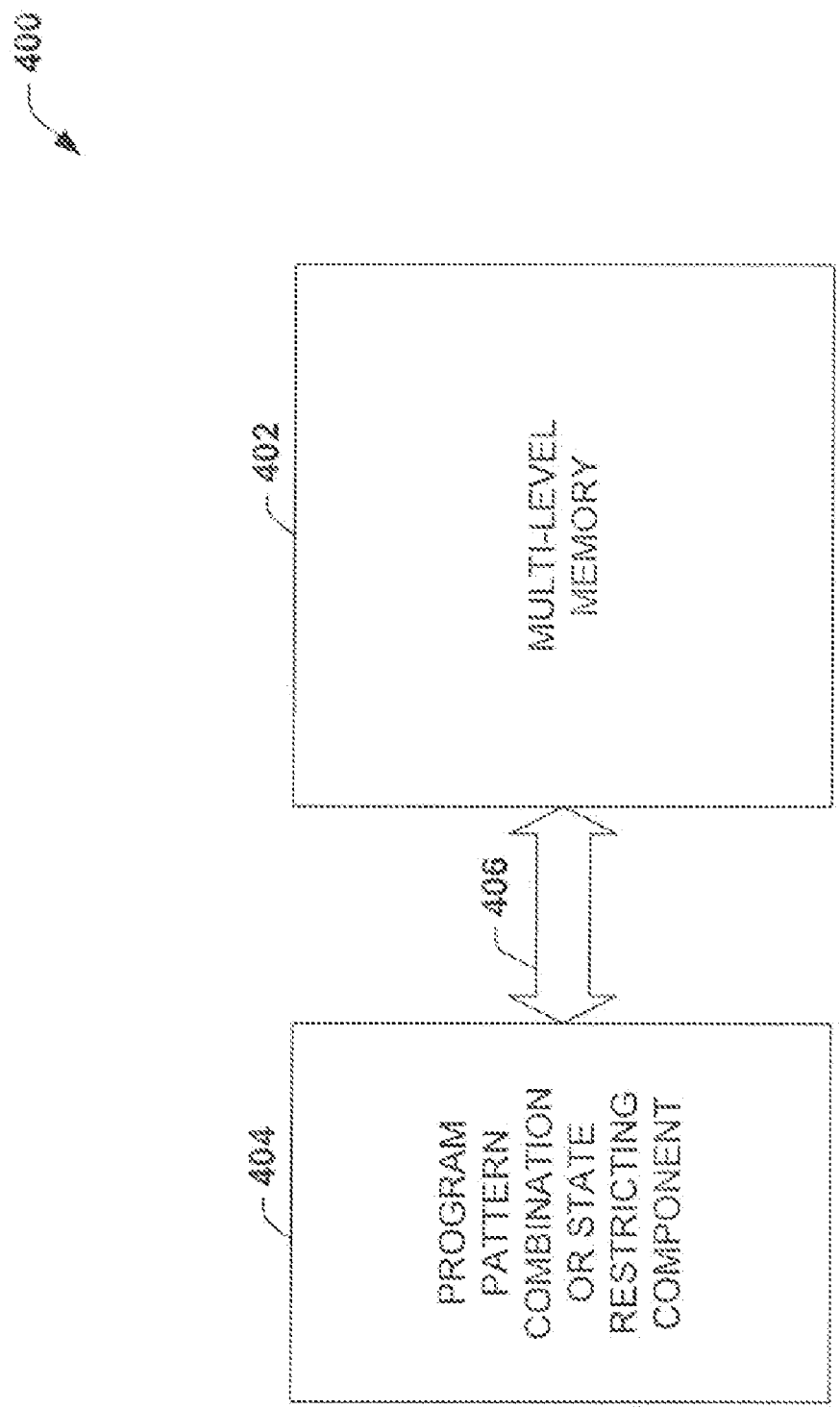
FIG. 4 is a simplified functional block diagram of an exemplary reduced state MLB memory device such as a reduced state QuadBit memory device configured to restrict the possible program pattern combinations that may be used to program the memory cell element-pairs and to improve and maintain Vt distribution margins.

FIG. 4 illustrates an exemplary reduced state MLB memory device 400 such as a reduced state QuadBit memory device such as may be used in accordance with several aspects of the present invention. Reduced state memory device 400, for example, is configured to restrict the possible program patterns (e.g., 11, 12, 21, 13, 31, 14, 41, 22, 23, 32, 24, 42, 33, 34, 43, 44) that may be used to a reduced subset combination of patterns (e.g., 11, 12, 21, 22, 23, 32, 24, 42, 33, 34, 43, 44) to program the memory cell element-pairs and to improve and maintain Vt distribution margins. For example, by eliminating the 13, 14, 41, 31 pattern combinations.

In one embodiment, for example, the reduced state memory device 400 comprises a multi-level memory 402, comprising at least one memory cell element-pair (e.g., comprising first and second elements) configured to store a blank level and two or more program levels. In one embodiment, the memory device 400 further comprises a program pattern combination or state restricting component 404 configured to store in the at least one memory cell element-pair of the multi-level memory 402 a program pattern selected from one of two blank levels (e.g., 11), two program levels (e.g., 22, 23, 24, 32, 33, 34, 42, 43, 44), and one blank level and one program level, the levels differing by less than a predetermined value. For example, if the levels differ by a "predetermined value" of 3, then the blank level and program level combinations are limited to 12, 21, 13 and 31 in a four level MLB, and the patterns: 41 and 14 are excluded. Similarly, if the predetermined value=2, then the blank level and program level combinations are limited to 12, 21 in a four level MLB, and the patterns: 13 and 31, 41 and 14 are excluded.

In another embodiment, this level difference between the blank level and the program level of the element-pairs may also correspond to a differential threshold voltage (e.g., $\Delta Vt$) between the blank level and the program level.

For example, the component 404 may comprise a program pattern combination or state restricting select circuit which identifies and restricts to a maximum allowable differential threshold voltage (e.g., if $\Delta Vt=2.2V$, the program pattern combinations which include a blank state may be limited to 12, 21). This is because the use of program patterns such as 31 and 41, which have a high threshold voltage difference between the element-pairs, will generate higher CBD element patterns such as 13 and 14. In this example, the 13, 14, 41 and 31 patterns would then be restricted or disallowed, as the 13 and 14 CBD voltages would be higher and reduce the read window, and program patterns 31 and 41 have a tendency to lose more charge due to program disturb.

As used in this application, the terms "component," "module," "system", "interface" and the like are generally intended to refer to a computer-related entity, either hardware such as a circuit, a combination of hardware and software, software, or software in execution. For example, a component may be, but is not limited to being, a process running on a processor, a processor, an object, an executable, a thread of execution, a program, and/or a computer such as an embedded processor. By way of illustration, both an application running on a controller and the controller can be a component. One or more components may reside within a process and/or thread of execution and a component may be localized on one computer and/or distributed between two or more computers.

In another embodiment, the levels differing by less than a predetermined value corresponds to a difference between a threshold voltage of the program level of the first element and the threshold voltage of the blank level of the second element (e.g., Vt(pgm)−Vt(blank)).

By limiting this threshold voltage difference, the CBD voltage shift is also reduced because the worse case CBD patterns are eliminated. This is because CBD is the Vt shift of a blank element due to the disturb/charge it receives during programming of the other bit in the cell, and this shift is greatest in those patterns which have the greatest difference in Vt between the elements. That is, CBD is the voltage shift or disturb from a blank (level 1) Vt voltage level for an element in an element-pair when the second element in that pair is programmed to a selected voltage threshold.

Figure 5:
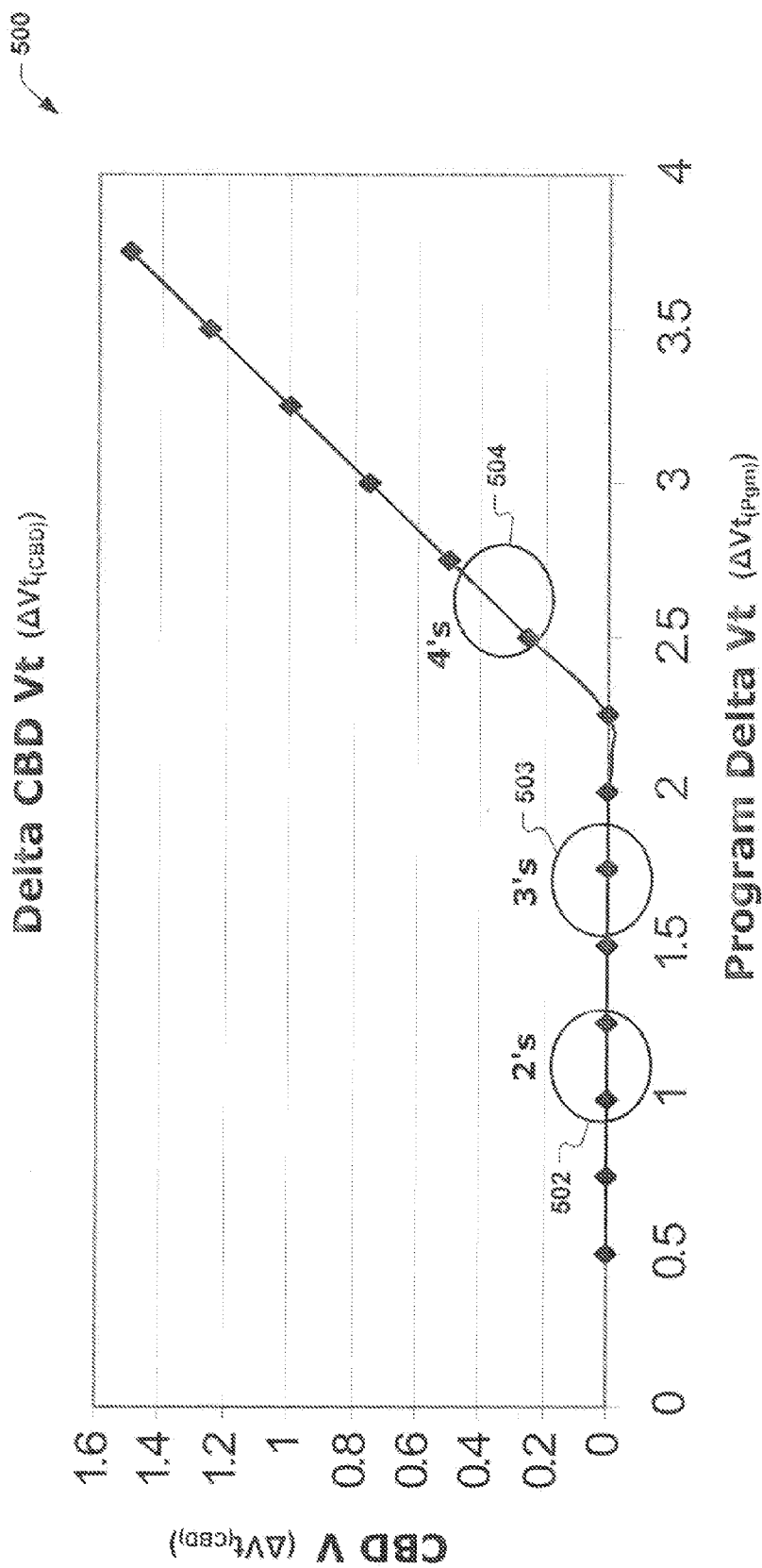
FIG. 5 is a plot of the change in CBD voltage for a change in program Vt such as may be observed in the distribution of FIG. 2B.

FIG. 5 illustrates a plot 500 of the change in CBD voltage (e.g., $\Delta Vt_{(CBD)}$ 212, 213, 214 of FIG. 2B) (along the vertical "Y" axis) for a change in program Delta Vt (along the horizontal "X" axis) such as may be observed in the distribution of FIG. 2B. Also illustrated, is the L2 program level 502 or 2× distribution family, the L3 program level 503 or 3× distribution family, and the L4 program level 504 or 4× distribution family.

The 1's or 1× (e.g., 11, 12, 13, 14) are the un-programmed Vt (blank) states of the transistor. The 12 pattern is the 1's state with the other side programmed to 2 or the lowest Vt program state. The 14 pattern is the 1's state with the other side programmed to the highest Vt level 4. As the other side of the transistor is programmed to a higher Vt, the 1's side will begin to increase in Vt by disturb due to the charge placed on the programmed side of the transistor. This is called CBD (complimentary bit disturb).

Plot 500 further illustrates that the CBD voltage (e.g., Vt(after disturb)−Vt(blank)) is a strong function of the program Vt once the program delta Vt ($\Delta Vt_{(Pgm)}$) increases above about 2.2 volts (e.g., for a Vds of about 1.4V), and the CBD voltage increases dramatically. Thus, it may be appreciated that the 14 and 41 program patterns are particularly problematic and good candidates for elimination by the level or state restriction component 404 of FIG. 4, where the 14 pattern is a limiting factor for 1× margin and read disturb.

Figure 6:
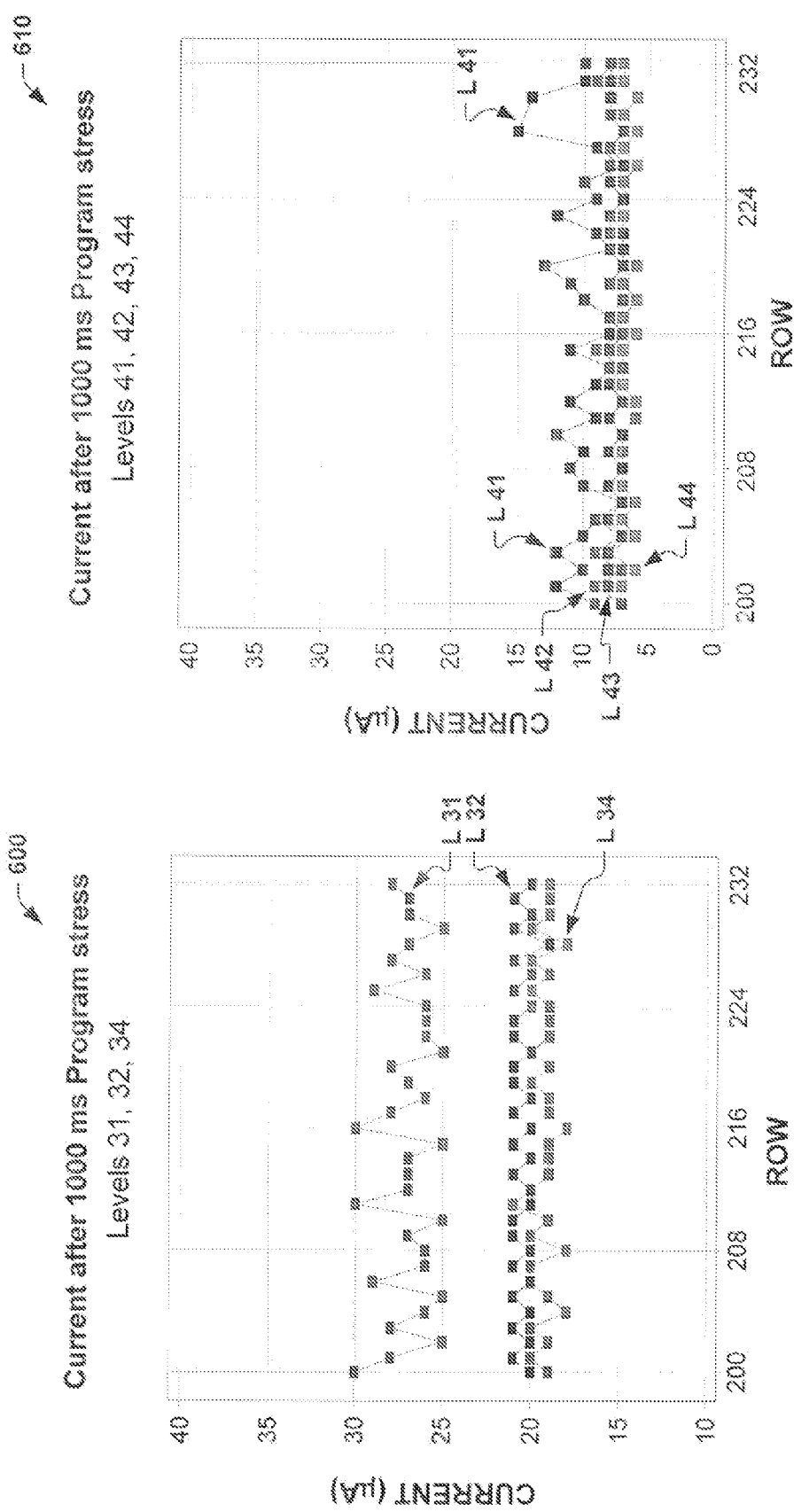
FIGS. 6A and 6B are data plots illustrating current changes of typical 3× and 4× program patterns, respectively, for four-level 16 state MLB memory cells measured after 1000 ms stress.

FIGS. 6A and 6B illustrate data plots 600 and 610 of current changes of typical 3X and 4X program patterns, respectively, for a group of four-level 16 state MLB memory cells measured after 1000 ms of program stress. Plot 600 illustrates the memory cell currents (μA) for the 31 (L 31), 32 (L 32), and 34 (L 34) program patterns after the 1000 ms of program voltage stress. It may be noted that the L 31 current is substantially greater than the other L 32 and L 34 program currents, because of the greater program disturb resulting in higher charge loss compared to program patterns 32 and 34 wherein both elements in the element pair are programmed, compared to the 31 pattern, for which one side is at a blank "1" state.

Similarly, plot 610 illustrates the memory cell currents (μA) for the 41 (L 41), 42 (L 42), 43 (L 43), and 44 (L 44) program patterns after 1000 ms of program stress. It may be noted that the L 41 current is again substantially greater than the other L 42, L 43 and L 44 program currents, because of the greater program disturb resulting in higher charge loss compared to program patterns 42, 43 and 44 wherein both elements in the element pair are programmed compared to 41 for which one side is at a blank "1" state. In accordance with the present invention, the 41 and 31 are eliminated, and the post disturb margin would improve (by 5 to 10 uA in this illustration).

The program disturb on a mirror bit or element cell is worse on a cell with one side of the transistor blank "L1". In plots 600 and 610, the 31 and 41 clearly show more charge loss (higher current) after 1000 ms program stress. The 32, 33, 34 and 42, 43, 44 patterns have a lower charge loss and are near the pre-stress current targets. In both cases, the post program disturb margin would improve by 5-10 uA with the new reduced state approach of eliminating 31 and 41. This type of disturb has been a limiting factor in the use of larger sectors (which equates to lower cost), and partial sector erase methods (which equates to better performance).

Figure 7:
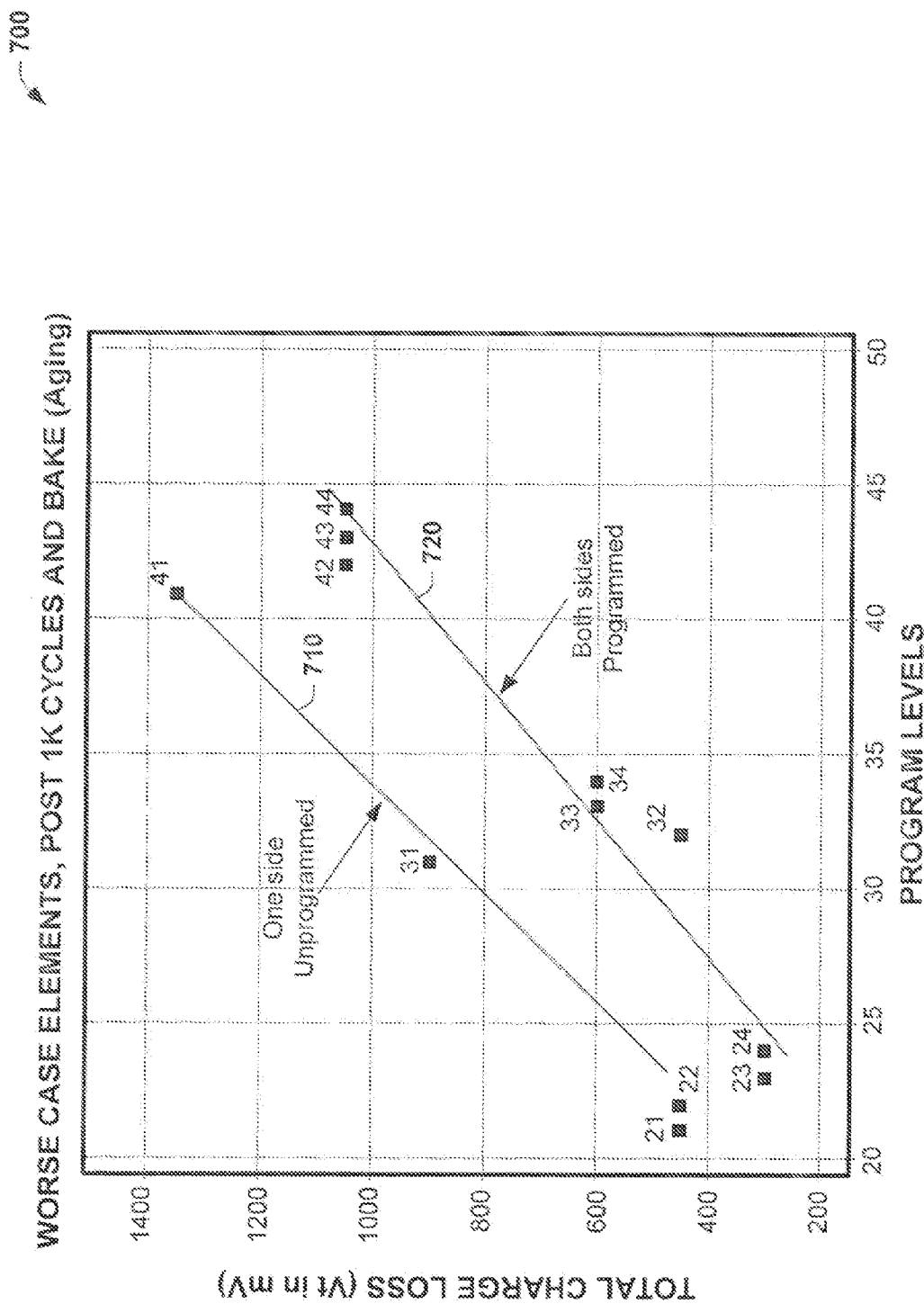
FIG. 7 is a data plot illustrating total charge loss for various worse case CBD program pattern combinations of four-level 16 state MLB memory cells measured after 1000 program-erase cycles and a bake which simulates aging.

FIG. 7 illustrates a data plot 700 of total charge loss (Y axis in mV) for all program pattern combinations of four-level (X axis in levels) 16 state MLB memory cells measured after 1000 program-erase cycles and a bake which simulates aging. In plot 700, the worse case charge loss results are along the plot line 710 of the 21, 31 and 41 patterns having one side unprogrammed (blank). Plot line 720, wherein both sides are programmed, illustrates all the other lower CBD voltage element pattern combinations (e.g., 23, 24, 32, 33, 34, 42, 43, and 44). The post-cycled and post bake (e.g., 100 cycles or greater) showed that the 41 distribution was shifting to a much lower Vt (charge loss) than the other 4× (42, 43, 44) distributions. In addition, the 31 element pattern is eliminated, in part, due to the shift in the program Vt with age.

Thus, it can be appreciated that by restricting a memory device from the use of these higher charge loss (e.g., eliminating 21, 31 and 41, eliminating 31 and 41 or eliminating just 41 as Reduced Quad −10 states, 12 states or 14 states) patterns, the memory cells of such a device utilized in accordance with the present invention, will suffer less charge loss over cycle and aging life stresses compared to all 16 states Quad. Thus, it is anticipated that such memory devices can be cycled more than existing methods while retaining an acceptable quality level.

Thus, after looking at the four-level MLB (e.g., QuadBit) behaviors both in the voltage and current domains, it becomes clear that the 14, 13, 41, and 31 program pattern combinations are limiting the read margins, disturb performance, and data retention capabilities and are thus restricted from the reduced state memory device of the present invention. In addition, such improvements may allow a manufacturer to improve cost and overhead time for memory device customers by using larger sectors and better wear leveling (cycle life).

One or more aspects of the present invention provide a method of forming and a method of programming a multi-level element memory device as illustrated and described herein.

Although the methodology is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

Figure 8:
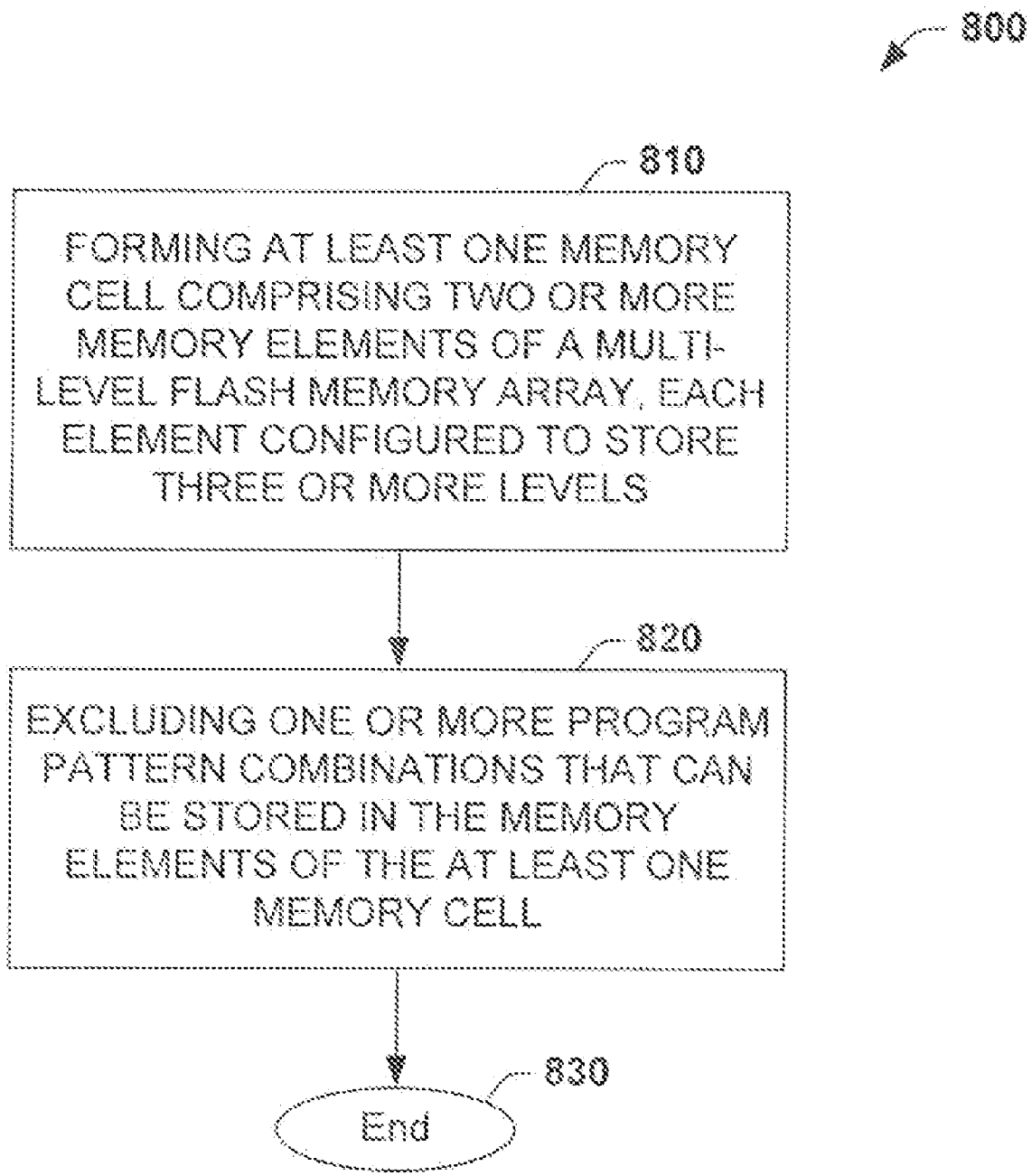
FIG. 8 is flow diagram illustrating an exemplary method of forming a reduced state MLB memory device in accordance with an aspect of the present invention.

FIG. 8 illustrates one embodiment of a method 800 of forming a memory device (e.g., reduced state MLB memory device 400 of FIG. 4) in accordance with the present invention. In one embodiment, method 800 of FIG. 8 comprises forming at 810 at least one memory cell comprising two or more memory elements (e.g., dual-element nitride storage flash memory cell 150 of FIG. 1B) of a multi-level flash memory array (402 of FIG. 4), each memory cell element configured to store three or more levels (e.g., L1, L2, L3, L4).

At 820 one or more program pattern combinations or states that can be stored in the two or more memory elements of the at least one memory cell (e.g., a cell comprising first and second elements of an element-pair) is/are excluded, for example, to improve the read margin, CBD effects and/or to reduce total charge loss. For example, the program pattern combinations or states may be restricted to a element pattern combination comprising one of two blank levels (e.g., 11), two program levels (e.g., 22, 23, 24, 32, 33, 34, 42, 43, 44), and one blank level and one program level, wherein the difference between the corresponding threshold voltage of the blank level and the program level is less than a difference threshold voltage (e.g., 12, 21). For example, for a 13 program pattern combination, the threshold voltage difference between the blank level (1) and the program level (3) may be such that this difference threshold voltage excludes this combination. Thus, the 13 pattern may represent a restricted state or restricted program pattern combination of establishing a restricted set of program pattern combinations.

Thereafter at 830, the method 800 ends.

Figure 9:
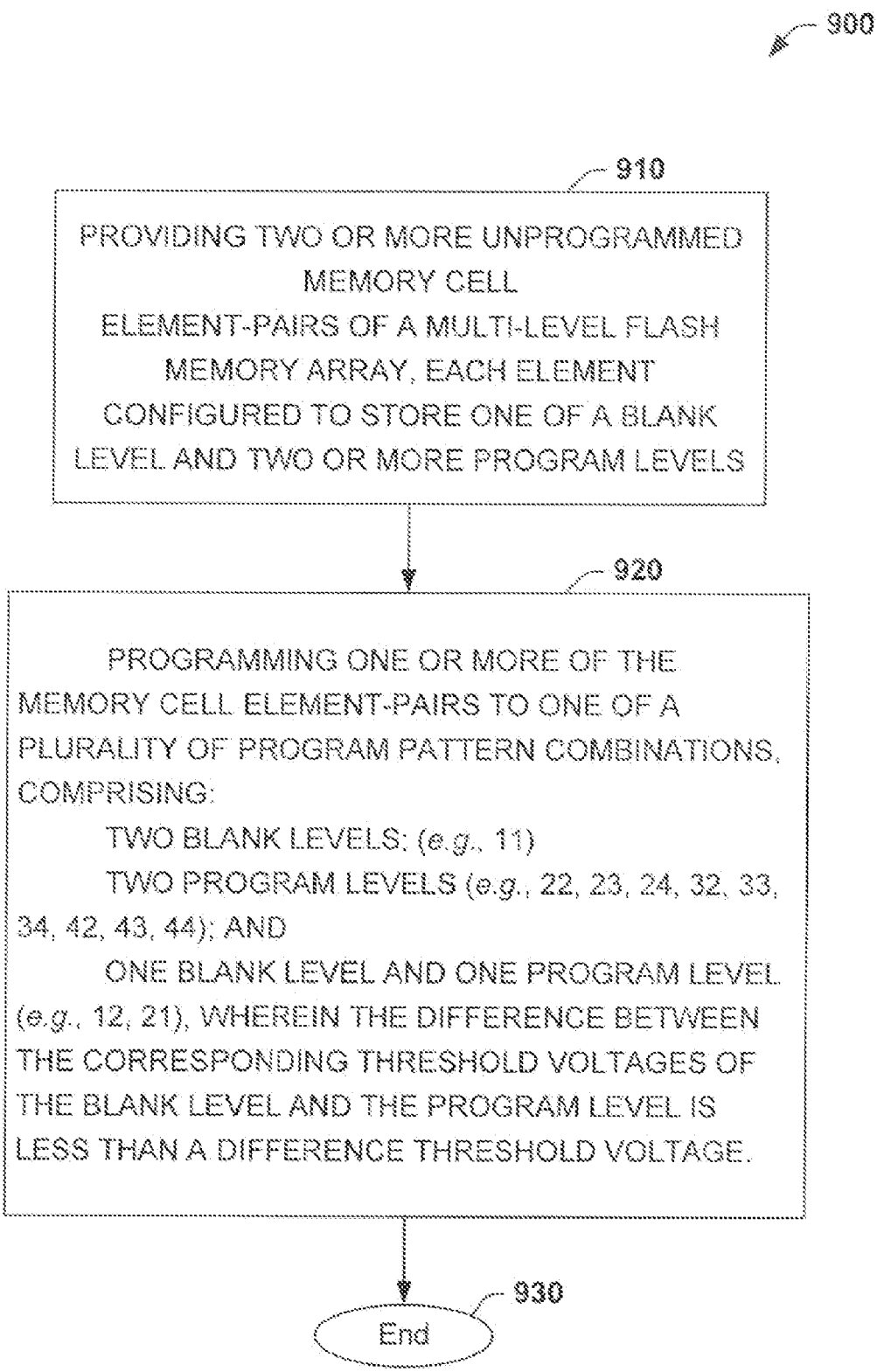
FIG. 9 is flow diagram illustrating an exemplary method of programming memory cell element-pairs of an MLB memory array in accordance with an aspect of the present invention.

FIG. 9 illustrates an embodiment of a method 900 of programming memory cell element-pairs (e.g., dual-element nitride storage flash memory cell 150 of FIG. 1B) of an MLB memory array (402 of FIG. 4) to improve and maintain Vt distribution margins of the MLB memory cells in accordance with an aspect of the present invention.

Assume for the sake of the following method discussion and the examples of FIG. 9, a dual element nitride storage flash (complementary element-pair) four-level per element memory cell similar to that of FIGS. 1A and 1B with L1 representing a blank or erased state, and L4 representing the highest program level similar to the levels of FIGS. 2A and 2B. Although L1 will represent the erased state in this example, it should be appreciated that method 900 will work for any erase and program level assignments and Vt distribution polarities of MLB memory cells or elements, and such variations are contemplated as falling with the scope of the present invention.

At 910 of method 900 of FIG. 9, two or more unprogrammed memory cell element-pairs (e.g., two blank levels, 11) of a multi-level flash memory array (e.g., 402 of FIG. 4) are provided, wherein each element of the element-pair configured to store one of a blank level (L1) and two or more program levels (e.g., L2, L3, L4).

Then, at 920, one or more of the memory cell element-pairs (e.g., of a wordline, sector, array, or any grouping of MLB cells including single or multi-element cells) are programmed to one of a plurality of program pattern combinations comprising two blank levels (e.g., 11), two program levels (e.g., 22, 23, 24, 32, 33, 34, 42, 43, 44), and one blank level and one program level (e.g., 12, 21) wherein the difference between the corresponding threshold voltage of the blank level and the program level (e.g., Vt(pgm)−Vt(blank)) is less than a difference threshold voltage (e.g., ΔVt).

For example, considering the 13, 31 or 14, 41 pattern combinations of the entire set of possible pattern combinations (e.g., the threshold voltage difference between the blank level (1) and the program levels (3 and 4, respectively) may be such that this difference threshold voltage (e.g., ΔVt, Vt(3)−Vt(1), or Vt(4)−Vt(1)) excludes these combinations. Thus, the 13, 31 or 14, 41 pattern combinations may represent restricted states or restricted pattern combinations in the establishment of a restricted set of pattern combinations. Therefore, the difference threshold voltage (e.g., −Vt) represents a maximum allowable threshold voltage difference between the first and second memory elements of the memory cell element-pair.

Thereafter at 930 the method 900 ends.

It will be appreciated that the programming of the element-pairs or memory cells may be quickly and efficiently programmed near to the target Vt using a set of Vd and Vg voltages for program pulsing without actually exceeding the target Vt and becoming over programmed, and wherein the pulse levels may increment in their respective levels until the program verify conditions are met indicating that the elements are programmed.

It is further anticipated that any combination of Vd stepping and Vg stepping may be utilized to achieve the programming of the memory cells in accordance with one or more aspects of the present invention.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., assemblies, devices, circuits, elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising".

What is claimed is:

1. A memory device comprising:
   at least one memory cell element-pair of a multi-level flash memory array, the memory cell element-pair comprising first and second elements, each element configured to store one of a blank level and two or more program levels; and
   a component configured to store in the at least one memory cell element-pair a program pattern of a plurality of program pattern combinations, comprising:
      two blank levels;
      two program levels; and
      one blank level and one program level, the levels differing by less than a predetermined value and configured to exclude from the storing, program pattern combinations having levels differing by the predetermined value or greater without replacing the excluded program pattern combinations with other combinations.

2. The memory device of claim 1, wherein the predetermined value corresponds to a maximum allowable difference between the corresponding threshold voltages of the blank level and the program level.

3. The memory device of claim 1, wherein the levels differing by less than a predetermined value corresponds to a difference between the threshold voltage of the program level of the first element and the threshold voltage of the blank level of the second element.

4. The memory device of claim 1, wherein the memory cells of the multi-level flash memory array comprise dual element nitride storage flash memory cells.

5. The memory device of claim 1, wherein the memory cells of the multi-level flash memory array comprise dual element nitride storage flash memory cells, and wherein the blank level and the two or more program levels correspond to three or more threshold voltages and three or more data states per element.

6. The memory device of claim 5, wherein the two or more program levels comprise three program levels, and wherein the predetermined value is 3, whereby the program pattern combinations comprise: 11, 22, 23, 24, 32, 33, 34, 42, 43, 44, 21, 12, 31, and 13, but exclude the 41 and 14 combinations.

7. A method of forming a memory device comprising:
   forming at least one memory cell of a multi-level flash memory array, each memory cell comprising two or more memory elements, each memory element configured to store three or more levels; and
   excluding one or more program pattern combinations that can be stored in the two or more memory elements of the at least one memory cell without replacing the excluded one or more program pattern combinations with other combinations.

8. The method of claim 7, wherein the memory cell comprises a memory cell element-pair comprising a first element and a second element, each element configured to store a blank level and two or more program levels.

9. The method of claim 8, wherein the excluding one or more program pattern combinations that can be stored in the at least one memory cell element-pair comprises restricting the program pattern combinations which may be stored to a set, comprising:
   two blank levels;
   two program levels; and
   one blank level and one program level, wherein the difference between the corresponding threshold voltages of the blank level and the program level is less than a difference threshold voltage and excluding from the programming, pattern combinations having threshold voltages differing by the difference threshold voltage or greater without replacing the excluded one or more program pattern combinations with other combinations.

10. The method of claim 9, wherein the difference threshold voltage is a maximum allowable voltage difference between the corresponding threshold voltages of the blank level and the program level.

11. The method of claim 9, wherein the difference threshold voltage is the difference between the threshold voltage of the program level of the first element and the threshold voltage of the blank level of the second element.

12. A method of programming memory cell element-pairs of a multi-level flash memory array, each element of the element-pairs configured to store one of a blank level and two or more program levels, the method comprising:
   providing two or more unprogrammed memory cell element-pairs; and
   programming one or more of the memory cell element-pairs to one of a plurality of program pattern combinations, comprising:
      two blank levels;
      two program levels; and
      one blank level and one program level, wherein the difference between the corresponding threshold voltage of the blank level and the program level is less than a difference threshold voltage and excluding from the programming, program pattern combinations having threshold voltages differing by the difference threshold voltage or greater without replacing the excluded program pattern combinations with other combinations.

13. The method of claim 12, wherein the difference threshold voltage corresponds to a maximum allowable threshold voltage difference between a first element of the element-pair from the blank level, when a second element of the element-pair is programmed to one of the two or more program levels.

14. The method of claim 12, further comprising excluding one or more of the program pattern combinations that can be stored in the at least one memory cell based on selecting only those pattern combinations that correspond to threshold voltages of the blank level and the program level that differ by less than the difference threshold voltage.

15. The method of claim 12, wherein the plurality of program patterns comprise four or more program patterns.

16. The method of claim 12, wherein the difference threshold voltage is the difference between the threshold voltage of the program level of the first element and the threshold voltage of the blank level of the second element.

17. The method of claim 12, wherein the blank level and two or more program levels correspond to three or more threshold voltages.

18. The method of claim 17, wherein the memory cells of the multi-level flash memory array comprise dual element nitride storage flash memory cells, and wherein the three or more threshold voltages correspond to three or more data states per bit or element.

19. The method of claim 12, wherein the two or more program levels comprise three program levels, and wherein the difference threshold voltage restricts the program pattern combinations to: 11, 22, 23, 24, 32, 33, 34, 42, 43, 44, 21, 12, 31, and 13, but exclude the 41 and 14 combinations.

20. The method of claim 12, wherein the two or more program levels comprise three program levels, and wherein the difference threshold voltage restricts the program pattern combinations to: 11, 22, 23, 24, 32, 33, 34, 42, 43, 44, 21, 12, but exclude the 31, 13, 41 and 14 combinations.

* * * * *